(12) United States Patent
Li (10) Patent No.: US 12,159,885 B2
(45) Date of Patent: Dec. 3, 2024

(54) MANUFACTURING METHOD OF MINI-LED BACKLIGHT PLATE AND MINI-LED BACKLIGHT PLATE

(71) Applicant: TCL China Star Optoelectronics Technology Co., Ltd., Guangdong (CN)

(72) Inventor: Lanyan Li, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 828 days.

(21) Appl. No.: 17/419,297

(22) PCT Filed: May 25, 2021

(86) PCT No.: PCT/CN2021/095712
§ 371 (c)(1),
(2) Date: Jun. 29, 2021

(87) PCT Pub. No.: WO2022/183602
PCT Pub. Date: Sep. 9, 2022

(65) Prior Publication Data
US 2023/0154940 A1 May 18, 2023

(30) Foreign Application Priority Data
Mar. 2, 2021 (CN) .......................... 202110231750.X (51) Int. Cl.
*H01L 27/12* (2006.01)
*H01L 25/16* (2023.01)

(52) U.S. Cl.
CPC ........ *H01L 27/1288* (2013.01); *H01L 25/167* (2013.01); *H01L 27/1248* (2013.01)

(58) Field of Classification Search
None
See application file for complete search history.

(56) References Cited

U.S. PATENT DOCUMENTS

| 7,794,799 B1 * | 9/2010 | Kim ..................... B01J 19/0046 427/457 |
| 2012/0075185 A1 | 3/2012 | Brug et al. |
| 2014/0087291 A1 | 3/2014 | Taniguchi et al. |
| 2015/0179586 A1 * | 6/2015 | Youk .................. G02F 1/13452 427/58 |

(Continued)

FOREIGN PATENT DOCUMENTS

| CN | 104730750 | 6/2015 |
| CN | 104808377 | 7/2015 |
| CN | 108269786 | 7/2018 |

(Continued)

*Primary Examiner* — William C Trapanese (57) ABSTRACT

A manufacturing method of a mini-LED backlight plate and the mini-LED backlight plate are provided. The manufacturing method of the mini-LED backlight plate includes: providing a substrate, defining at least one display region, defining at least one mark region with metal mark objects in a non-display region, covering a mask on the substrate, exposing the at least one mark region, adopting a hydrophilic material to form a layer of a thin film on the at least one mark region, removing the mask, coating a hydrophobic passivation coating layer on the substrate, exposing the metal mark objects, and aligning by an exposure machine accurately.

14 Claims, 7 Drawing Sheets

(56) References Cited

U.S. PATENT DOCUMENTS

2020/0098635 A1\* 3/2020 Jeon ..................... H01L 21/56

FOREIGN PATENT DOCUMENTS

| CN | 108488693 | 9/2018 |
| CN | 108919582 | 11/2018 |
| CN | 111063693 | 4/2020 |
| CN | 211125656 | 7/2020 |
| CN | 111627952 | 9/2020 |
| CN | 112114717 | 12/2020 |

\* cited by examiner providing a substrate, defining a plurality of display regions arranged in a rectangular array manner on a surface of a side of the substrate, wherein other region on the surface of the side of the substrate except for the plurality of display regions is a non-display region; defining a plurality of mark regions in the non-display region; disposing the plurality of mark regions corresponding to the plurality of display regions one-to-one; disposing metal mark objects in the mark regions; and further defining a plurality of cutting regions separating any two adjacent display regions in the non-display region ~ 10 forming a structure of a driving circuit on the display region of the substrate ~ 20 covering the surface of the side of the substrate by a mask, using the mask to cover the plurality of display regions and part of the non-display region on the surface of the side of the substrate to allow the plurality of mark regions and the plurality of cutting regions to be exposed outside, and adopting a hydrophilic material to form a layer of the thin film on the plurality of mark regions and the plurality of cutting regions ~ 30 removing the mask and coating a hydrophobic material on the entire surface of the side of the substrate to form a passivation coating layer ~ 40 cutting the substrate along the plurality of cutting regions to form a sheet of a backlight plate ~ 50

FIG. 14 providing the substrate, defining a plurality of display regions on a surface of a side of the substrate, wherein, other region on the surface of the side of the substrate except for the plurality of display regions is a non-display region; and defining a plurality of cutting regions separating any two adjacent display regions in the non-display region ~ 10' covering the surface of the side of the substrate by a mask, using the mask to cover the plurality of display regions and part of the non-display region on the surface of the side of the substrate to allow the plurality of cutting regions to be exposed outside, and adopting a hydrophilic material to form a layer of the thin film on the plurality of cutting regions ~ 20' removing the mask and coating a hydrophobic material on the entire surface of the side of the substrate to form a passivation coating layer ~ 30' cutting the substrate along the plurality of cutting regions to form a sheet of a backlight plate ~ 40'

FIG. 15

MANUFACTURING METHOD OF MINI-LED BACKLIGHT PLATE AND MINI-LED BACKLIGHT PLATE

RELATED APPLICATIONS

This application is a National Phase of PCT Patent Application No. PCT/CN2021/095712 having International filing date of May 25, 2021, which claims the benefit of priority of Chinese Patent Application No. 202110231750.X filed on Mar. 2, 2021. The contents of the above applications are all incorporated by reference as if fully set forth herein in their entirety.

FIELD AND BACKGROUND OF THE INVENTION

The present application relates to the field of display technology and particularly to a manufacturing method of a mini light emitting diode (mini-LED) backlight plate and the mini-LED backlight plate.

In order to ensure working stability of thin film transistor devices in manufacturing of mini light emitting diode (mini-LED) backlight plates, and to maximize light utilization and optical quality as much as possible, there is a process of passivation coating layers, wherein a thickness of the passivation coating layers is less than 30 μm, and reflectivity of which is greater than 80%. In order to enable the passivation coating layers to form patterns at set positions, it is necessary to dispose metal mark objects on surfaces of substrates for alignment by exposure machines. When the set metal mark objects are used for alignment by the exposure machines, light of light sources penetrates the passivation coating layers and is reflected on the metal mark objects, and then is inputted to charge-coupled device (CCD) lenses with a function of detecting reflected light. Therefore, the alignment process of the passivation coating layers by the exposure machines is completed, so that the passivation coating layers can form corresponding patterns according to the set positions and sizes. One of current formation methods of the passivation coating layer is to fully coat the passivation coating layers on surfaces of the substrates. Regarding passivation coating materials with high reflectivity, most light from light sources is directly reflected after passing through the passivation coating layers, and it is difficult for the light to reach the surfaces of the metal mark objects, so the exposure machines cannot be aligned accurately, resulting in the passivation coating layers being unable to form the set patterns. In addition, after the process of passivation coating layers is completed, and corresponding size is cut in sequence, due to a relatively high film thickness of the passivation coating layers and inherent material characteristics, the passivation coating layers are prone to be jagged in the cutting regions during cutting. In severe cases, it will cause conditions of edge cracking and peeling off. Another one of the current formation methods of the passivation coating layers is not coating the passivation coating layers on entire edges of the surfaces of the substrates where the metal mark objects are disposed, which is conducive to the CCD lens reading the positions of the metal mark objects for accurate alignment by the exposure machines. However, edge regions of the substrates are wasted, and maximum utilization rate of the substrates cannot be realized, which causes production cost to rise sharply.

A technical problem is that in another one of the current formation methods of the passivation coating layers, although not coating the passivation coating layers on the entire edge of the surfaces of the substrates where the metal mark objects are disposed is conducive to the CCD lens reading the positions of the metal mark objects for accurate alignment by the exposure machines, edge regions of the substrates are wasted, and maximum utilization rate of the substrates cannot be realized. This can cause production cost to rise sharply.

SUMMARY OF THE INVENTION

Embodiments of the present application provide a manufacturing method of a mini light emitting diode (mini-LED) backlight plate and the mini-LED backlight plate, which allows a passivation coating layer with a set pattern to be formed, while a maximum utilization rate of a substrate is realized, and production cost is reduced.

One embodiment of the present application provides a manufacturing method of a mini light emitting diode (mini-LED) backlight plate, including following steps:

providing a substrate, defining at least one display region on a surface of a side of the substrate, other region on the surface of the side of the substrate except for the at least one display region is a non-display region, defining at least one mark region in the non-display region, and disposing a metal mark objects in the mark region;

covering the surface of the side of the substrate by a mask, covering the at least one display region and part of the non-display region on the surface of the side of the substrate by the mask to allow the at least one mark region to be exposed outside, and adopting a hydrophilic material to form a layer of a thin film on the at least one mark region;

removing the mask; and coating a hydrophobic material on the entire surface of the side of the substrate to form a passivation coating layer.

One embodiment of the present application further provides the manufacturing method of the mini-LED backlight plate, including following steps:

providing a substrate, defining a plurality of display regions on a surface of a side of the substrate, wherein other region on the surface of the side of the substrate except for the plurality of display regions is a non-display region, defining a plurality of cutting regions separating any two of the adjacent display regions in the non-display region;

covering the surface of the side of the substrate by a mask, covering the plurality of display regions and part of the non-display region on the surface of the side of the substrate by the mask to allow the plurality of cutting regions to be exposed outside, and adopting a hydrophilic material to form a layer of a thin film on the plurality of cutting regions;

removing the mask; coating a hydrophobic material on the entire surface of the side of the substrate to form a passivation coating layer; and cutting the substrate along the plurality of cutting regions to form a sheet of a backlight plate.

One embodiment further provides a mini-LED backlight plate manufactured by adopting the aforesaid manufacturing method.

In the manufacturing method of the mini-LED backlight plate of the embodiments of the present application, other regions except the at least one mark region on the surface of the side of the substrate are covered by covering the mask on the surface of the substrate, the hydrophilic material is adopted to form the layer of the thin film on the at least one mark region exposed outside, the mask is removed, and the hydrophobic passivation coating layer is coated on the entire surface of the side of the substrate. Because the hydrophilic film formed on the at least one mark region makes it difficult for the hydrophobic passivation coating layer to form a film during coating, thereby exposing the metal mark objects, the exposure machines can align accurately, and the passivation coating layer of the set pattern is allowed to be formed. Meanwhile, the surface of the substrate can be coated with the passivation coating layer in the other regions except the at least one mark region, which can realize the maximum utilization rate of the substrate and reduce production cost.

BRIEF DESCRIPTION OF THE SEVERAL VIEWS OF THE DRAWINGS

To more clearly illustrate the technical solutions of the embodiments of the present application, the required accompanying figures for description of embodiments is described in brief as follow. Obviously, the accompanying figures described below are only part of the embodiments of the present application, from which figures those skilled in the art can derive further figures without making any inventive efforts.

DESCRIPTION OF SPECIFIC EMBODIMENTS OF THE INVENTIONS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application.

Figure 1:
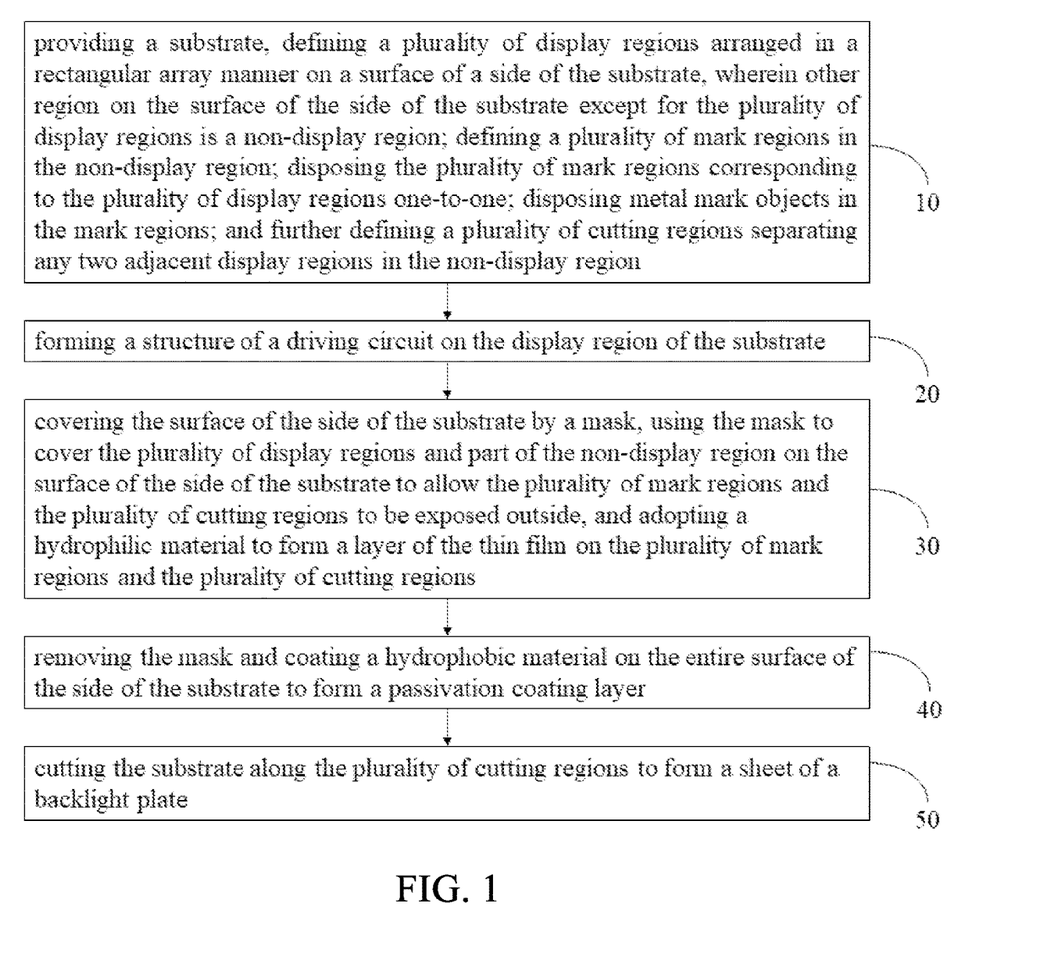
FIG. 1 is a flowchart of a manufacturing method of a mini light emitting diode (mini-LED) backlight plate provided by one embodiment of the present application.
Figure 2:
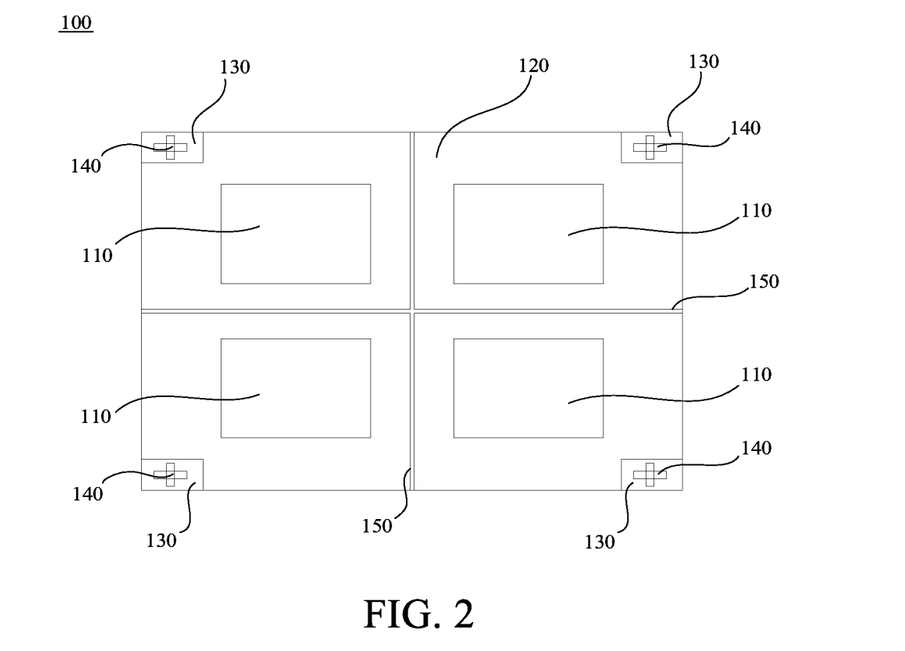
FIG. 2 is a first operation process chart provided by one embodiment of the present application.
Figure 3:
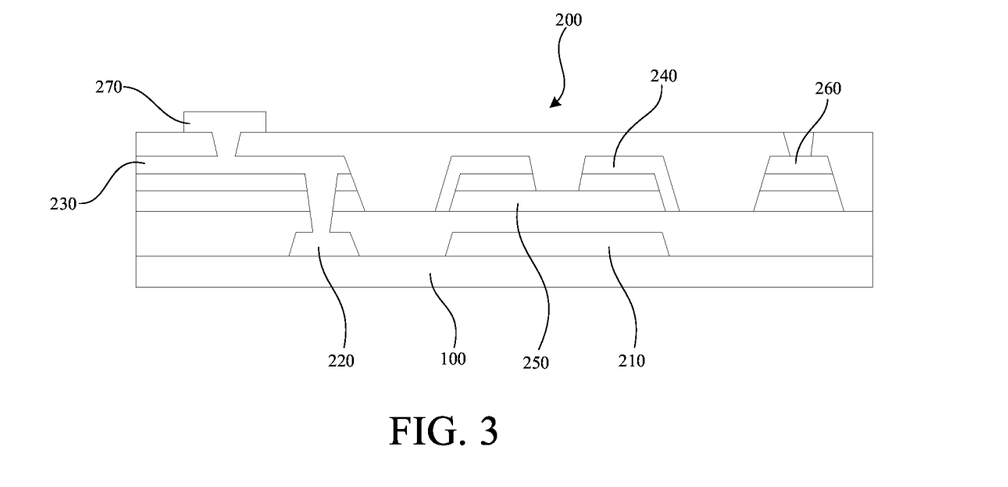
FIG. 3 is a structural schematic diagram of the mini-LED backlight plate provided by one embodiment of the present application.
Figure 4:
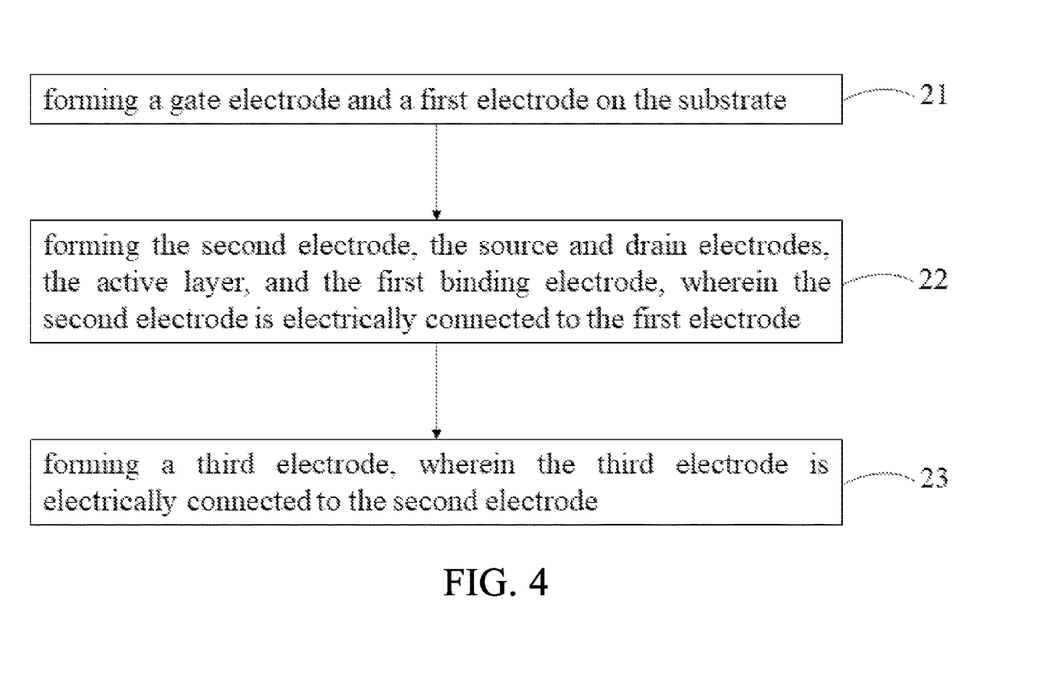
FIG. 4 is a flowchart of forming a structure of a driving circuit provided by one embodiment of the present application.
Figure 5:
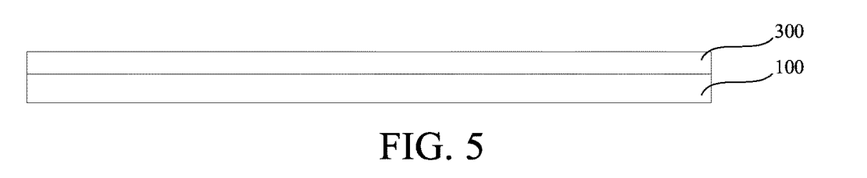
FIG. 5 is a second operation process chart provided by one embodiment of the present application.
Figure 6:
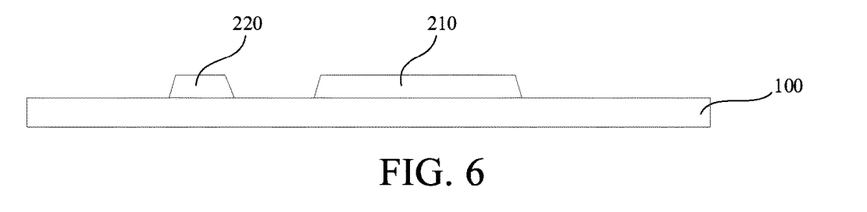
FIG. 6 is a third operation process chart provided by one embodiment of the present application.
Figure 7:
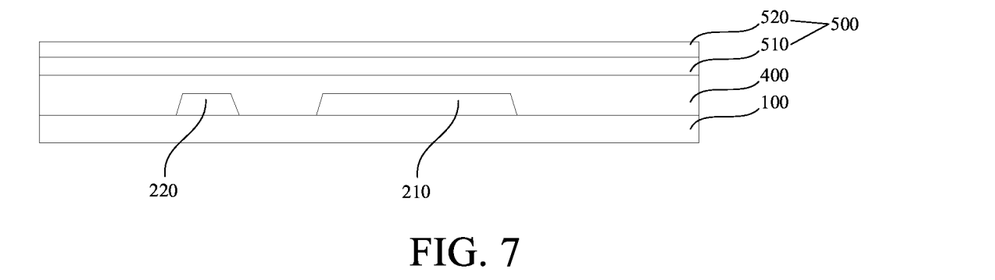
FIG. 7 is a fourth operation process chart provided by one embodiment of the present application.
Figure 8:
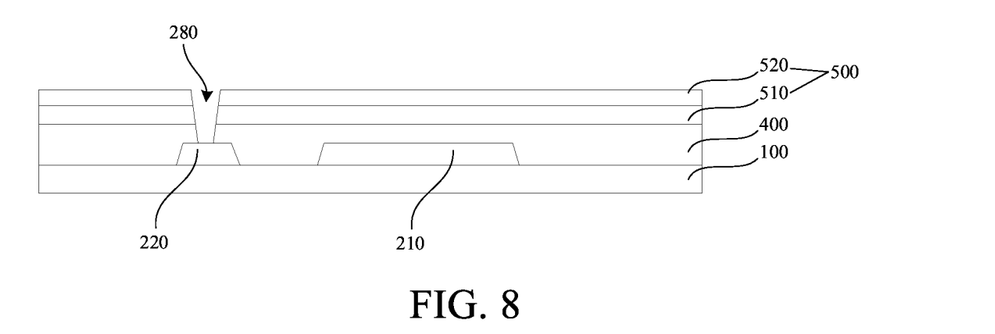
FIG. 8 is a fifth operation process chart provided by one embodiment of the present application.
Figure 9:
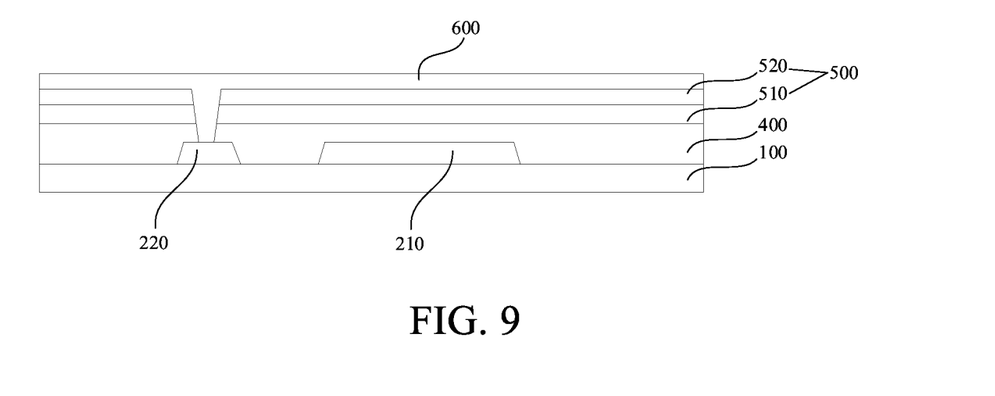
FIG. 9 is a sixth operation process chart provided by one embodiment of the present application.
Figure 10:
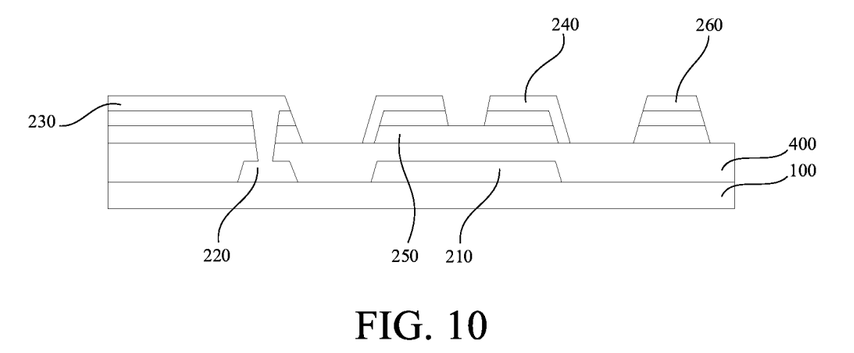
FIG. 10 is a seventh operation process chart provided by one embodiment of the present application.
Figure 11:
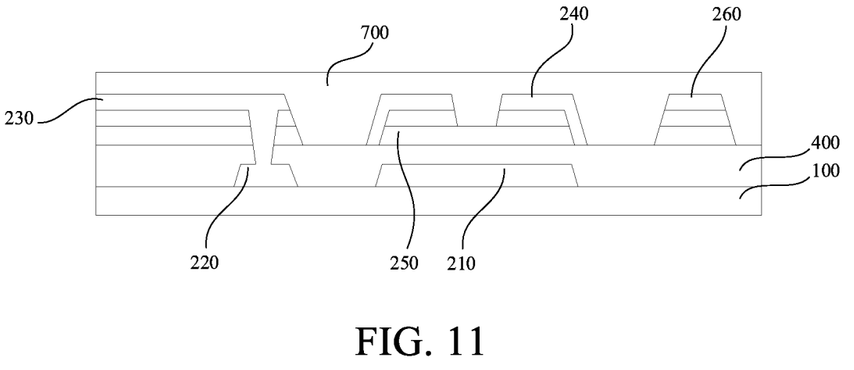
FIG. 11 is an eighth operation process chart provided by one embodiment of the present application.
Figure 12:
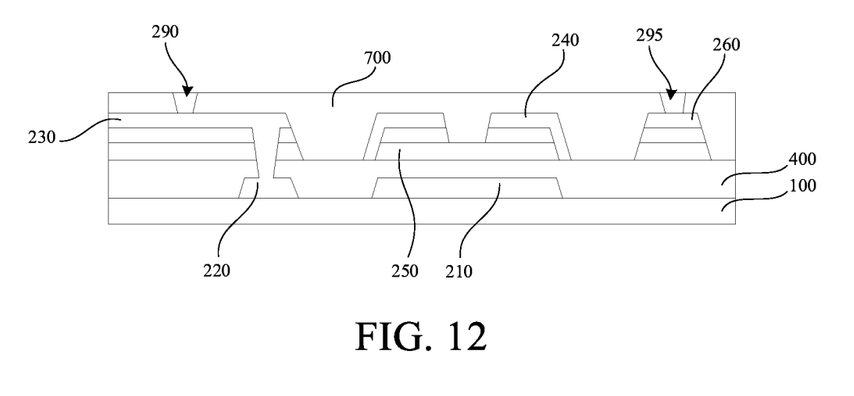
FIG. 12 is a ninth operation process chart provided by one embodiment of the present application.
Figure 13:
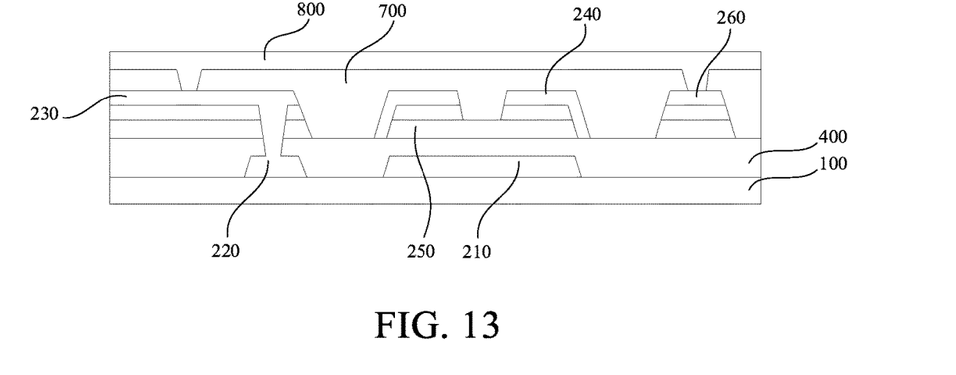
FIG. 13 is a tenth operation process chart provided by one embodiment of the present application.
Figure 14:
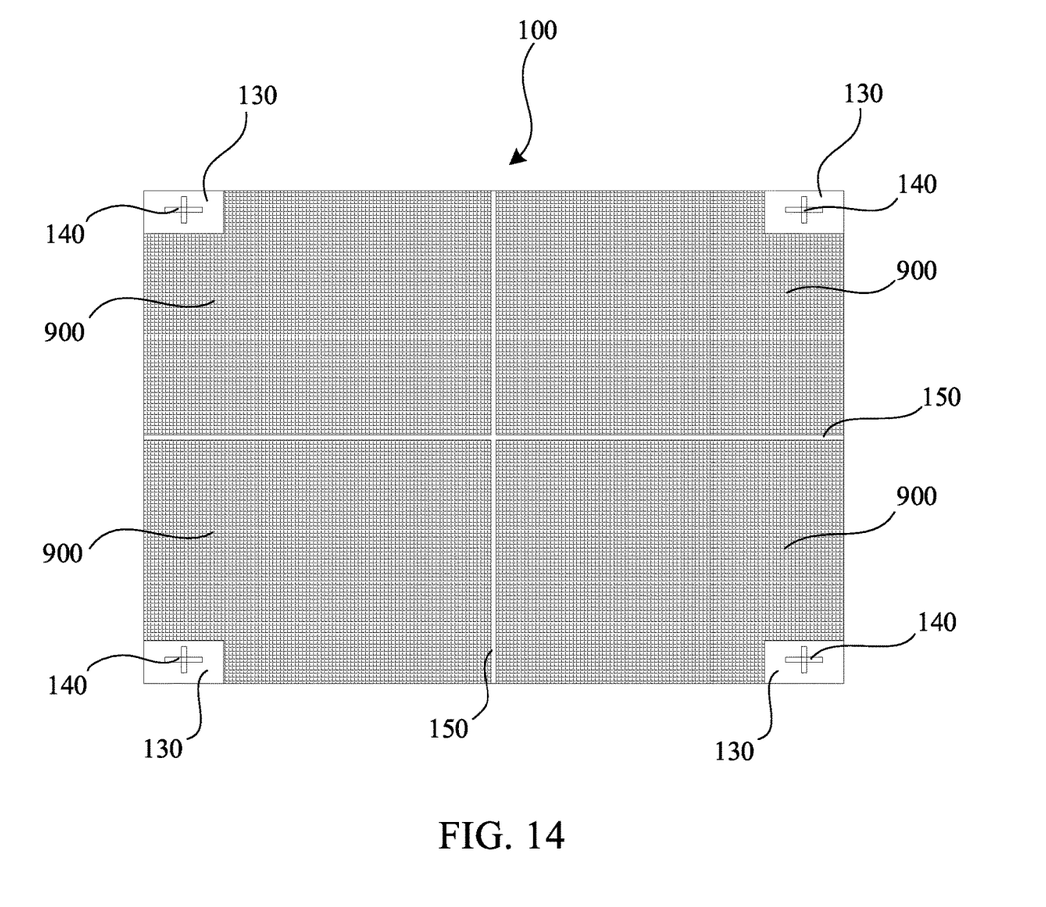
FIG. 14 is an eleventh operation process chart provided by one embodiment of the present application.

Please refer to FIGS. 1-14. FIG. 1 is a flowchart of a manufacturing method of a mini light emitting diode (mini-LED) backlight plate provided by one embodiment of the present application. FIG. 2 is a first operation process chart provided by one embodiment of the present application. FIG. 3 is a structural schematic diagram of the mini-LED backlight plate provided by one embodiment of the present application. FIG. 4 is a flowchart of forming a structure of a driving circuit provided by one embodiment of the present application. FIG. 5 is a second operation process chart provided by one embodiment of the present application. FIG. 6 is a third operation process chart provided by one embodiment of the present application. FIG. 7 is a fourth operation process chart provided by one embodiment of the present application. FIG. 8 is a fifth operation process chart provided by one embodiment of the present application. FIG. 9 is a sixth operation process chart provided by one embodiment of the present application. FIG. 10 is a seventh operation process chart provided by one embodiment of the present application. FIG. 11 is an eighth operation process chart provided by one embodiment of the present application. FIG. 12 is a ninth operation process chart provided by one embodiment of the present application. FIG. 13 is a tenth operation process chart provided by one embodiment of the present application. FIG. 14 is an eleventh operation process chart provided by one embodiment of the present application. In one embodiment of the present application, the manufacturing method of the mini-LED backlight plate includes following steps.

Step 10: as illustrated in FIG. 2, providing a substrate 100, defining a plurality of display regions 110 arranged in a rectangular array manner on a surface of a side of the substrate 100, wherein other region on the surface of the side of the substrate 100 except for the plurality of display regions 110 is a non-display region 120; defining a plurality of mark regions 130 in the non-display region 120; disposing the plurality of mark regions 130 corresponding to the plurality of display regions 110 one-to-one; disposing metal mark objects 140 in the mark regions 130; and further defining a plurality of cutting regions 150 separating any two adjacent display regions 110 in the non-display region 120.

In the step 10, the substrate 100 can be a glass substrate. It should be understood that the substrate 100 can also be made of other suitable rigid or flexible materials according to application requirements. The display region 110 is configured to dispose the driving circuit and light emitting devices to provide a display function. The display region 110 is preferably disposed as a plurality of display regions 110 arranged in a rectangular array manner, thereby being conducive to manufacturing a plurality of backlight plates on the substrate 100 to improve production efficiency. The plurality of mark regions 130 are disposed corresponding to the plurality of display regions one-to-one. The metal mark objects 140 are disposed in the mark regions 130. By using the metal mark objects 140 for accurate alignment by an exposure machine, passivation coating layer of a set pattern is formed. After the backlight plate is completely manufactured, it can be cut into a plurality of small pieces along the plurality of cutting regions 150. It can be understood that only one display region 110 and one corresponding mark region 130 are also allowed to be disposed on the substrate 100. At this time, the backlight plate does not need to be cut into small the pieces after the manufacturing of the backlight plate is completed, so there is no need to divide the cutting regions 150 on one side of the surface of the substrate 100.

Step 20: forming a structure of a driving circuit 200 on the display region of the substrate 100 as illustrated in FIG. 3.

The driving circuit 200 includes a gate electrode 210, a first electrode 220, a second electrode 230, a third electrode 270, source and drain electrodes 240, an active layer 250, and a first binding electrode 260. The gate electrode 210 and the first electrode 220 are disposed on a same layer. The gate electrode 210, the source and drain electrodes 240, and the active layer 250 compose a thin film transistor. The first electrode 220, the second electrode 230, and the third electrode 270 are located on a side of the thin film transistor. The first binding electrode 260 is located on another side of the thin film transistor. The second electrode 230 is electrically connected to the first electrode 220. The third electrode 270 is electrically connected to the second electrode 230. The third electrode 270 is configured to be electrically connected to a chip on film. The first binding electrode 260 is configured to be electrically connected to a light emitting diode.

In some embodiments, as illustrated in FIG. 4, steps of forming the structure of the driving circuit 200 on the display region of the substrate 100 includes the following.

Step 21: forming a gate electrode 210 and a first electrode 220 on the substrate 100.

Optionally, as illustrated in FIGS. 5 and 6, in the step 21, a first conductive layer 300 is formed on the substrate 100, and a patterning process is performed on the first conductive layer 300 to obtain the gate electrode 210 and the first electrode 220 disposed on the same layer.

Specifically, by forming the entire surface of the first conductive layer 300 on the substrate 100, forming the entire surface of the photoresist layer covering the first conductive layer 300, using a photomask to expose the photoresist layer, using a developer solution to develop the photoresist layer, and etching the first conductive layer 300 that is not covered by the photoresist layer to remove the remaining photoresist layer, the gate electrode 210 and the first electrode 220 are obtained.

Step 22: forming the second electrode 230, the source and drain electrodes 240, the active layer 250, and the first binding electrode 260, wherein the second electrode 230 is electrically connected to the first electrode 220.

Optionally, as illustrated in FIGS. 7-10, in the step 22, a first insulation layer 400 covering the gate electrode 210, the first electrode 220, and the substrate 100 is formed; a semiconductor layer 500 is formed on a side of the first insulation layer 400 away from the substrate 100; a first via hole 280 penetrating the first insulation layer 400 and the semiconductor layer 500 and communicating with the first electrode 220 is formed; a second conductive layer 600 is formed in the first via hole 280 and on the semiconductor layer 500; a patterning process is performed on the second conductive layer 600 and the semiconductor layer 500; the second electrode 230, the source and drain electrodes 240, the active layer 250, and the first binding electrode 260 are obtained; and the second electrode 230 is electrically connected to the first electrode 220 through the first via hole 280.

Specifically, a chemical vapor deposition manner is used to form the first insulation layer 400 covering the gate electrode 210, the first electrode 220, and the substrate 100. The first insulation layer 400 is a gate insulation layer. Then, amorphous silicon layer 510 covering the first insulation layer 400 and an n-type doped amorphous silicon layer 520 are sequentially formed. An entire surface of a photoresist layer is formed on the n-type doped amorphous silicon layer 520, and the photoresist layer is exposed by using a photomask. After a developing process of a developer solution, the n-type doped amorphous silicon layer 520, the amorphous silicon layer 510, and the first insulation layer 400 corresponding to the first electrode 220 are etched to form the first via hole 280 penetrating the first insulation layer 400, the n-type doped amorphous silicon layer 520, and the amorphous silicon layer 510. Sputtering deposition manner is adopted to form an entire surface of the second conductive layer 600 in the first via hole 280 and on the n-type doped amorphous silicon layer 520. The entire surface of the photoresist layer is formed on the second conductive layer 600. A halftone grayscale mask plate is adopted to expose the photoresist layer to define a photoresist completely removed region, a photoresist semi-remained region, and a photoresist fully remained region. After a photoresist of the photoresist completely removed region is processed by the developer solution, the second conductive layer 600, the amorphous silicon layer 510, and the n-type doped amorphous silicon layer 520 are etched, and the second electrode 230 and the first binding electrode 260 are obtained. The second electrode 230 is electrically connected to the first electrode 220 through the first via hole 280. After a photoresist of the photoresist semi-remained region is processed by the developer solution, the n-type doped amorphous silicon layer 520 and the second conductive layer 600 of the photoresist semi-remained region are etched, and the source and drain electrodes 240 and the active layer 250 are obtained. The source and drain electrodes 240 are disposed corresponding to the active layer 250 and are electrically connected to the active layer 250. The photoresist layer of the photoresist fully remained region is removed.

Step 23: forming a third electrode 270, wherein the third electrode 270 is electrically connected to the second electrode 230.

Optionally, as illustrated in FIGS. 11-13, in the step 23, a second insulation layer 700 covering the first binding electrode 260, the second electrode 230, the source and drain electrodes 240, the active layer 250, and the first insulation layer 400 is formed; a second via hole 290 penetrating the second insulation layer 700 and communicating with the second electrode 230 is formed; a third via hole 295 penetrating the second insulation layer 700 and communicating with the first binding electrode 260 is formed; a third conductive layer 800 is formed in the second via hole 290 and on the second insulation layer 700; a patterning process is performed on the third conductive layer 800 to obtain a third electrode 270; and the third electrode 270 is electrically connected to the second electrode 230 through the second via hole 290.

Specifically, an entire surface of the third conductive layer 800 is formed in the second via hole 290, in the third via hole 295, and on the second insulation layer 700; an entire surface of a photoresist layer is formed on the third conductive layer 800; and after exposing the photoresist layer by using a photomask and developing by the developer solution, the third conductive layer 800 is etched to remove a remaining photoresist layer to allow the first binding electrode 260 to be exposed to obtain the third electrode 270. A manufacturing material of the third conductive layer 800 is indium tin oxide. The third electrode 270 is electrically connected to the second electrode 230 through the second via hole 290.

It should be understood that in this method, the substrate 100 provided in the step 10 can already have included the driving circuit 200 disposed in the display region 110, but does not need to include processing steps of specially forming the driving circuit 200 on the substrate 100.

Step 30: covering the surface of the side of the substrate 100 by a mask 900, using the mask 900 to cover the plurality of display regions 110 and part of the non-display region 120 on the surface of the side of the substrate 100 to allow the plurality of mark regions 130 and the plurality of cutting regions 150 to be exposed outside, and adopting a hydrophilic material to form a layer of the thin film on the plurality of mark regions 130 and the plurality of cutting regions 150, as illustrated in FIG. 14.

In the step 30, the mask 900 is configured to shield one side of the substrate 100 to remove other regions of the plurality of mark regions 130 and the plurality of cutting regions 150, and to expose the plurality of mark regions 130 and the plurality of cutting regions 150, which is conducive to the hydrophilic material forming the thin film on the plurality of mark regions 130 and the plurality of cutting regions 150. Meanwhile, the hydrophilic material will not be coated on other regions to affect the formation of the passivation coating layer on the other regions.

In some embodiments, the hydrophilic material is poly (methyl methacrylate).

In some embodiments, a steam spray manner or a spraying manner is adopted to allow the hydrophilic material to form the thin film on the plurality of mark regions 130 and the plurality of cutting regions 150.

Step 40: removing the mask 900 and coating a hydrophobic material on the entire surface of the side of the substrate 100 to form a passivation coating layer.

In the step 40, after the mask 900 is removed, when the hydrophobic passivation coating layer is coated on the entire surface of the side of the substrate 100, as the hydrophilic film is formed on the plurality of mark regions 130 and the plurality of the cutting regions 150 of one side of the substrate 100, and the hydrophobic passivation coating layer cannot form a film on the plurality of mark regions 130 and the plurality of cutting regions 150, the metal mark objects 140 and the plurality of cutting regions 150 on the plurality of mark regions 130 are exposed, and the passivation coating layer can be formed on the other region on the surface of the substrate 100 except the plurality of mark regions 130 and the plurality of cutting regions 150.

Step 50: cutting the substrate 100 along the plurality of cutting regions 150 to form a sheet of a backlight plate.

In the step 50, because the hydrophobic passivation coating layer cannot form a film on the cutting regions 150, the plurality of cutting regions 150 are exposed, which allows cutting to the passivation coating layer to be prevented, and situations of cracking and peeling off occurring on the passivation coating layer on the edge of the backlight plate will not occur. It should be understood that if only one display region 110 is disposed on the surface of the substrate 100, there is no need to cut the substrate 100.

In some embodiments, a material of the hydrophobic passivation coating layer is WPR. Between the steps of removing the mask 900 and coating the hydrophobic material on the entire surface of the side of the substrate 100 to form the passivation coating layer and cutting the substrate 100 along the plurality of cutting regions 150 to form the sheet of the backlight plate, the following step is further included: performing a first baking process, an exposure process, a development process, and a second baking process on the substrate 100 sequentially.

Wherein, WPR is a positive photoresist material or a negative photoresist material from JSR Micro, Inc. (Sunnyvale, California) with a trademark of WPR. Photoresist materials of WPR series are a positive photoresist material or a negative photoresist material having a low curing temperature and can be formed from a thickness of about 5 microns to about 20 microns. In a red-green-blue (RGB) negative color resist process of a WPR material, a pattern can be formed through processes of coating, exposure, and development, which can be well linked to factories of thin film transistor liquid crystal displays (TFT-LCDs). Furthermore, it is not necessary to cut the glass substrate into small pieces before performing the process of coating the passivation coating layer, which can greatly improve production efficiency.

Preferably, a thickness of the passivation coating layer is less than 10 μm. The passivation coating layer with a smaller thickness can reduce costs, and it has a relatively high reflectivity of more than 80% at a same time, which can improve optical quality of the backlight.

In the manufacturing method of the mini-LED backlight plate of the embodiments of the present application, other region except the plurality of mark regions 130 on the surface of the side of the substrate 100 is covered by covering the mask 900 on the surface of the substrate 100, the hydrophilic material is adopted to form the layer of the thin film on the plurality of mark region 130 exposed outside, the mask 900 is removed, and the hydrophobic passivation coating layer is coated on the entire surface of the side of the substrate 100. Because the hydrophilic film formed on the plurality of mark regions 130 makes it difficult for the hydrophobic passivation coating layer to form a film during coating, thereby exposing the metal mark objects 140, the exposure machines can align accurately, and the passivation coating layer of the set pattern is allowed to be formed. Meanwhile, the surface of the substrate 100 can be coated with the passivation coating layer in the other regions except the plurality of mark regions 130, which can realize the maximum utilization rate of the substrate 100 and reduce production cost.

Figure 15:
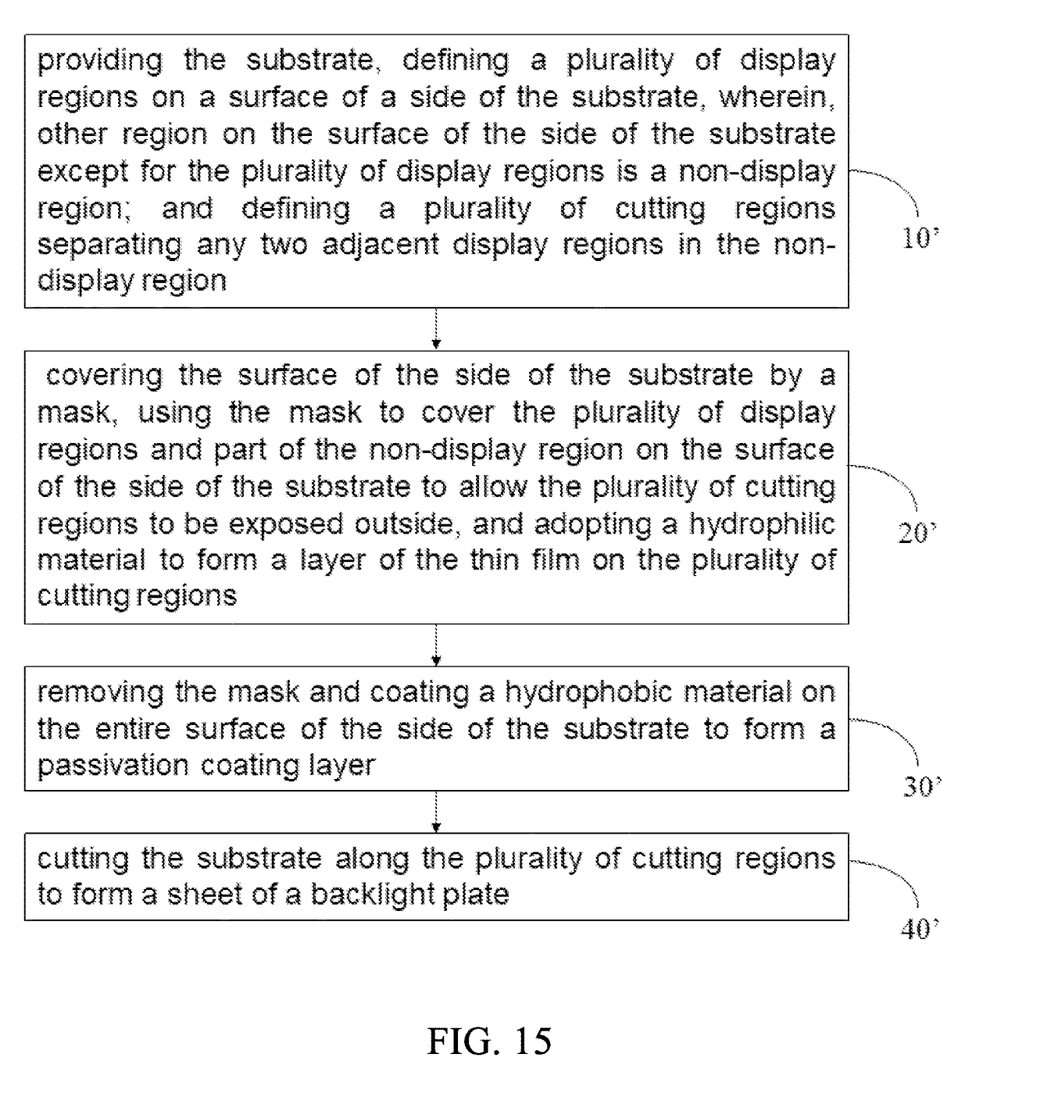
FIG. 15 is a flowchart of another manufacturing method of the mini-LED backlight plate provided by one embodiment of the present application.

Please refer to FIG. 15. FIG. 15 is a flowchart of another manufacturing method of the mini-LED backlight plate provided by one embodiment of the present application. In one embodiment of the present application, the manufacturing method of the mini-LED backlight plate includes following steps.

Step 10': with reference to FIG. 2, providing the substrate 100, defining a plurality of display regions 110 on a surface of a side of the substrate 100, wherein, other region on the surface of the side of the substrate 100 except for the plurality of display regions 110 is a non-display region 120; and defining a plurality of cutting regions 150 separating any two adjacent display regions 110 in the non-display region 120.

Step 20': with reference to FIG. 14, covering the surface of the side of the substrate 100 by a mask 900, using the mask 900 to cover the plurality of display regions 110 and part of the non-display region 120 on the surface of the side of the substrate 100 to allow the plurality of cutting regions 150 to be exposed outside, and adopting a hydrophilic material to form a layer of the thin film on the plurality of cutting regions 150.

Step 30': removing the mask 90 and coating a hydrophobic material on the entire surface of the side of the substrate 100 to form a passivation coating layer.

Step 40': cutting the substrate 100 along the plurality of cutting regions 150 to form a sheet of a backlight plate.

In the manufacturing method of the mini-LED backlight plate of the embodiments of the present application, because the hydrophobic passivation coating layer cannot form a film on the cutting regions 150, the plurality of cutting regions 150 are exposed, which allows cutting to the passivation coating layer during cutting the substrate 100 to form the sheet of a backlight plate to be prevented, and situations of cracking and peeling off occurring on the passivation coating layer on the edge of the backlight plate will not occur.

In some embodiments, the hydrophilic material is poly (methyl methacrylate).

In some embodiments, a steam spray manner or a spraying manner is adopted to allow the hydrophilic material to form the thin film on the plurality of cutting regions 150.

In some embodiments, in the step 10', a plurality of mark regions 130 are further defined in the non-display region 120, the plurality of mark regions 130 are disposed corresponding to the plurality of display regions 110 one-to-one, and metal mark objects 140 are disposed in the mark regions 130. In the step 20', the mask covers the plurality of display regions 110 and part of the non-display region 120 on the surface of the side of the substrate 100 to allow the plurality of mark regions 130 and the plurality of cutting regions 150 to be exposed outside, and a hydrophilic material is adopted to form a layer of the thin film on the plurality of mark regions 130 and the plurality of cutting regions 150.

In some embodiments, a material of the hydrophobic passivation coating layer is WPR. Between the step 30' and the step 40', the following step is further included: performing a first baking process, an exposure process, a development process, and a second baking process on the substrate 100 sequentially.

One embodiment further provides a mini-LED backlight plate manufactured by adopting the aforesaid manufacturing method.

Detailed description of the manufacturing method of the mini-LED backlight plate and the mini-LED backlight plate provided by the embodiments of the present application is described above. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. A manufacturing method of a mini light emitting diode (mini-LED) backlight plate, comprising:
    providing a substrate, defining at least one display region on a surface of a side of the substrate, wherein other region on the surface of the side of the substrate except for the at least one display region is a non-display region, defining at least one mark region in the non-display region, and disposing a metal mark object in the mark region;
    covering the surface of the side of the substrate by a mask;
    covering the at least one display region and part of the non-display region on the surface of the side of the substrate by the mask to allow the at least one mark region to be exposed outside;
    adopting a hydrophilic material to form a layer of a thin film on the at least one mark region; and
    removing the mask, and coating a hydrophobic material on the entire surface of the side of the substrate to form a passivation coating layer;
    wherein providing the substrate, defining the at least one display region on the surface of the side of the substrate, wherein the other region on the surface of the side of the substrate except for the at least one display region is the non-display region, defining the at least one mark region in the non-display region, and disposing the metal mark object in the mark region comprise:
    defining a plurality of display regions arranged in a rectangular array manner on the surface of the side of the substrate, defining the at least one mark region in the non-display region, disposing the at least one mark region corresponding to the plurality of display regions one-to-one, and defining a plurality of cutting regions separating any two adjacent display regions in the non-display region.

2. The manufacturing method of the mini-LED backlight plate as claimed in claim 1, wherein covering the surface of the side of the substrate by the mask, covering the at least one display region and the part of the non-display region on the surface of the side of the substrate by the mask to allow the at least one mark region to be exposed outside, and adopting the hydrophilic material to form the layer of the thin film on the at least one mark region comprise:
    covering the plurality of display regions and part of the non-display region on the surface of the side of the substrate by the mask to allow the at least one mark region to be exposed outside, and adopting the hydrophilic material to form the layer of the thin film on the at least one mark region and the plurality of cutting regions.

3. The manufacturing method of the mini-LED backlight plate as claimed in claim 2, wherein after removing the mask and coating the hydrophobic material on the entire surface of the side of the substrate to form the passivation coating layer, the manufacturing method of the mini-LED backlight plate further comprises:
    cutting the substrate along the plurality of cutting regions to form a sheet of a backlight plate.

4. The manufacturing method of the mini-LED backlight plate as claimed in claim 3, wherein the hydrophobic material of the passivation coating layer is a positive photoresist or a negative photoresist, and
    between removing the mask and coating the hydrophobic material on the entire surface of the side of the substrate to form the passivation coating layer and cutting the substrate along the plurality of cutting regions to form the sheet of the backlight plate, the manufacturing method of the mini-LED backlight plate further comprises:
    performing a first baking process, an exposure process, a development process, and a second baking process on the substrate sequentially.

5. The manufacturing method of the mini-LED backlight plate as claimed in claim 4, wherein a thickness of the passivation coating layer is less than 10 μm.

6. The manufacturing method of the mini-LED backlight plate as claimed in claim 4, wherein the hydrophilic material is poly (methyl methacrylate).

7. The manufacturing method of the mini-LED backlight plate as claimed in claim 6, wherein a steam spray manner or a spraying manner is adopted to allow the hydrophilic material to form the thin film on the at least one mark region and the plurality of cutting regions.

8. A manufacturing method of a mini light emitting diode (mini-LED) backlight plate, comprising:
    providing a substrate, defining a plurality of display regions on a surface of a side of the substrate, wherein other region on the surface of the side of the substrate except for the plurality of display regions is a non-display region, and defining a plurality of cutting regions separating any two adjacent display regions in the non-display region;

covering the surface of the side of the substrate by a mask, covering the plurality of display regions and part of the non-display region on the surface of the side of the substrate by the mask to allow the plurality of cutting regions to be exposed outside, and adopting a hydrophilic material to form a layer of a thin film on the plurality of cutting regions;

removing the mask, and coating a hydrophobic material on the entire surface of the side of the substrate to form a passivation coating layer; and cutting the substrate along the plurality of cutting regions to form a sheet of a backlight plate;

wherein providing the substrate, defining the plurality of display regions on the surface of the side of the substrate, wherein the other region on the surface of the side of the substrate except for the plurality of display regions is the non-display region, and defining the plurality of cutting regions separating any two adjacent display regions in the non-display region comprise:

defining the at least one mark region in the non-display region, disposing the at least one mark region corresponding to the plurality of display regions one-to-one, and disposing metal mark objects in the at least one mark region.

9. The manufacturing method of the mini-LED backlight plate as claimed in claim 8, wherein covering the surface of the side of the substrate by the mask, covering the plurality of display regions and the part of the non-display region on the surface of the side of the substrate by the mask to allow the plurality of cutting regions to be exposed outside, and adopting the hydrophilic material to form the layer of the thin film on the plurality of cutting regions comprise:

covering the plurality of display regions and part of the non-display region on the surface of the side of the substrate by the mask to allow the at least one mark region to be exposed outside, and adopting the hydrophilic material to form the layer of the thin film on the at least one mark region and the plurality of cutting regions.

10. The manufacturing method of the mini-LED backlight plate as claimed in claim 8, wherein the hydrophobic material of the passivation coating layer is a positive photoresist or a negative photoresist, and between removing the mask and coating the hydrophobic material on the entire surface of the side of the substrate to form the passivation coating layer and cutting the substrate along the plurality of cutting regions to form the sheet of the backlight plate, the manufacturing method of the mini-LED backlight plate further comprises:

performing a first baking process, an exposure process, a development process, and a second baking process on the substrate sequentially.

11. A mini-LED backlight plate, comprising:

a substrate, wherein at least one display region is defined on a surface of a side of the substrate, other region on the surface of the side of the substrate except for the at least one display region is a non-display region, at least one mark region is defined in the non-display region, and a metal mark object is disposed in the mark region;

a thin film disposed on the mark region, wherein the thin film is made of a hydrophilic material; and a passivation coating layer made of a hydrophobic material disposed on the entire surface of the side of the substrate;

wherein a plurality of display regions arranged in a rectangular array manner are defined on the surface of the side of the substrate, the at least one mark region is defined in the non-display region, the at least one mark region is disposed corresponding to the plurality of display regions one-to-one, and a plurality of cutting regions separating any two adjacent display regions are defined in the non-display region.

12. The mini-LED backlight plate as claimed in claim 11, wherein the hydrophobic material of the passivation coating layer is a positive photoresist or a negative photoresist.

13. The mini-LED backlight plate as claimed in claim 12, wherein a thickness of the passivation coating layer is less than 10 μm.

14. The mini-LED backlight plate as claimed in claim 12, wherein the hydrophilic material is poly (methyl methacrylate).

* * * * *